United States Patent
Ikoma et al.

(10) Patent No.: US 7,709,900 B2
(45) Date of Patent: *May 4, 2010

(54) SEMICONDUCTOR DEVICE

(75) Inventors: Daisaku Ikoma, Osaka (JP); Atsuhiro Kajiya, Hyogo (JP); Katsuhiro Ootani, Nara (JP); Kyoji Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 121 days.

This patent is subject to a terminal disclaimer.

(21) Appl. No.: 11/892,053

(22) Filed: Aug. 20, 2007

(65) Prior Publication Data

US 2008/0042214 A1    Feb. 21, 2008

Related U.S. Application Data

(62) Division of application No. 11/148,208, filed on Jun. 9, 2005, now Pat. No. 7,279,727.

(30) Foreign Application Priority Data

Jul. 22, 2004    (JP)    .............................. 2004-213903

(51) Int. Cl.
*H01L 23/62* (2006.01)
(52) U.S. Cl. ................ 257/369; 257/371; 257/E27.064
(58) Field of Classification Search ................. 257/369, 257/371, E27.064
See application file for complete search history.

(56) References Cited

U.S. PATENT DOCUMENTS 5,420,447 A    5/1995    Waggoner
5,438,214 A    8/1995    Egawa et al.
5,498,897 A    3/1996    Komatsuzaki et al.
5,847,421 A    12/1998    Yamaguchi (Continued)

FOREIGN PATENT DOCUMENTS

JP    64-50443    2/1989

(Continued)

OTHER PUBLICATIONS

Japanese Office Action, with English translation, issued in Japanese Patent Application No. JP 2004-213903, mailed Apr. 1, 2008.

(Continued)

*Primary Examiner*—Phat X Cao
(74) *Attorney, Agent, or Firm*—McDermott Will & Emery LLP

(57) ABSTRACT

A semiconductor device includes a semiconductor substrate; a diffusion region which is formed in the semiconductor substrate and serves as a region for the formation of a MIS transistor; an element isolation region surrounding the diffusion region; at least one gate conductor film which is formed across the diffusion region and the element isolation region, includes a gate electrode part located on the diffusion region and a gate interconnect part located on the element isolation region, and has a constant dimension in the gate length direction; and an interlayer insulating film covering the gate electrode. The semiconductor device further includes a gate contact which passes through the interlayer insulating film, is connected to the gate interconnect part, and has the dimension in the gate length direction larger than the gate interconnect part.

10 Claims, 7 Drawing Sheets

U.S. PATENT DOCUMENTS

| | | |
|---|---|---|
| 6,222,758 B1 | 4/2001 | Higashide |
| 6,376,351 B1 * | 4/2002 | Tsai .......................... 438/592 |
| 7,279,727 B2 * | 10/2007 | Ikoma et al. ................ 257/204 |
| 7,405,450 B2 * | 7/2008 | Lyu et al. .................... 257/388 |
| 2007/0063288 A1 | 3/2007 | Furuta et al. |

FOREIGN PATENT DOCUMENTS

| | | |
|---|---|---|
| JP | 64-89468 | 4/1989 |
| JP | 05-006965 | 1/1993 |
| JP | 08-272075 | 10/1996 |
| JP | 9-246541 | 9/1997 |
| JP | 10-032253 | 2/1998 |
| JP | 11-297850 | 10/1999 |
| JP | 2001-127158 | 5/2001 |
| JP | 2002-026125 A | 1/2002 |
| JP | 2003-218117 | 7/2003 |

OTHER PUBLICATIONS

Chinese Office Action, with English Translation, issued in Chinese Patent Application No. CN 200510085984.9, issued on Apr. 14, 2008.

* cited by examiner

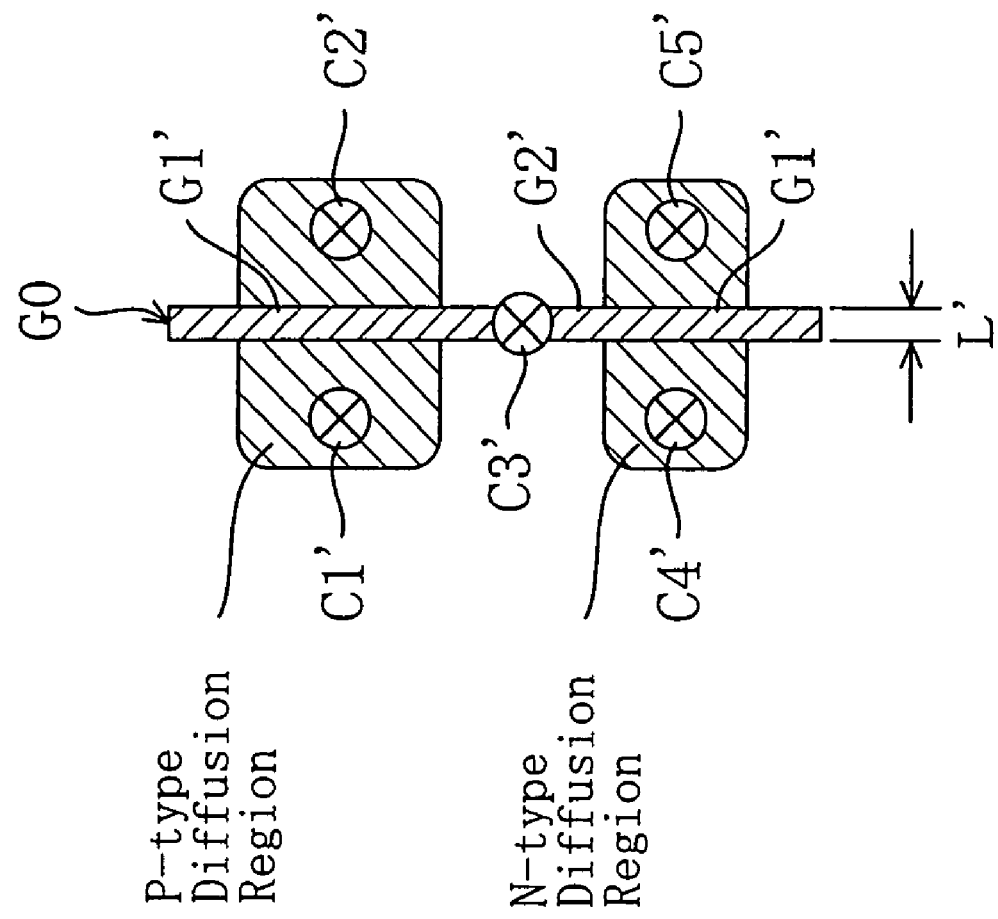
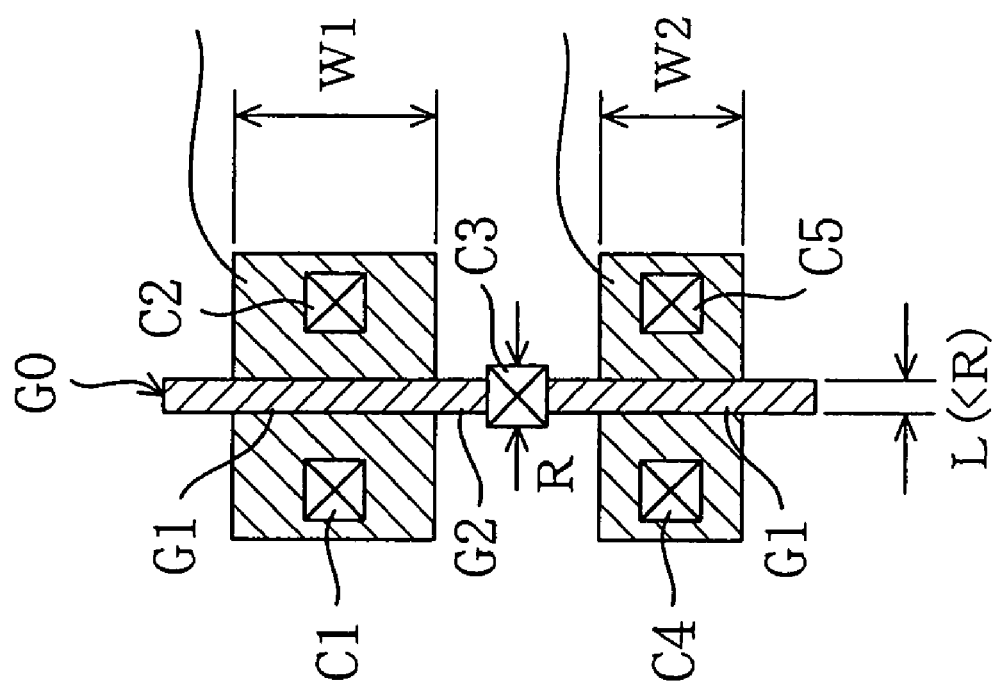

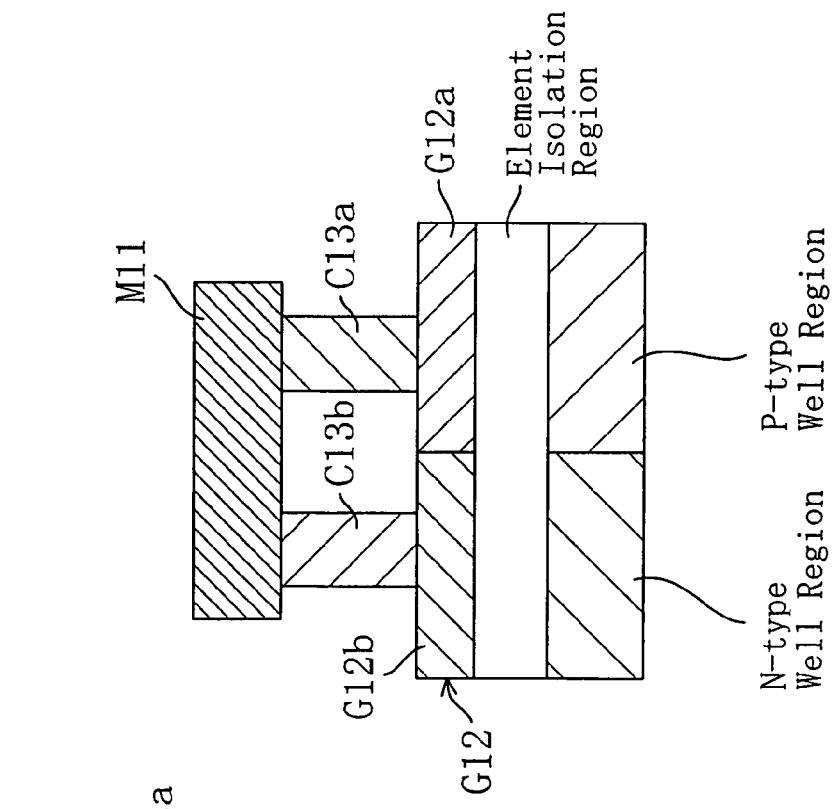

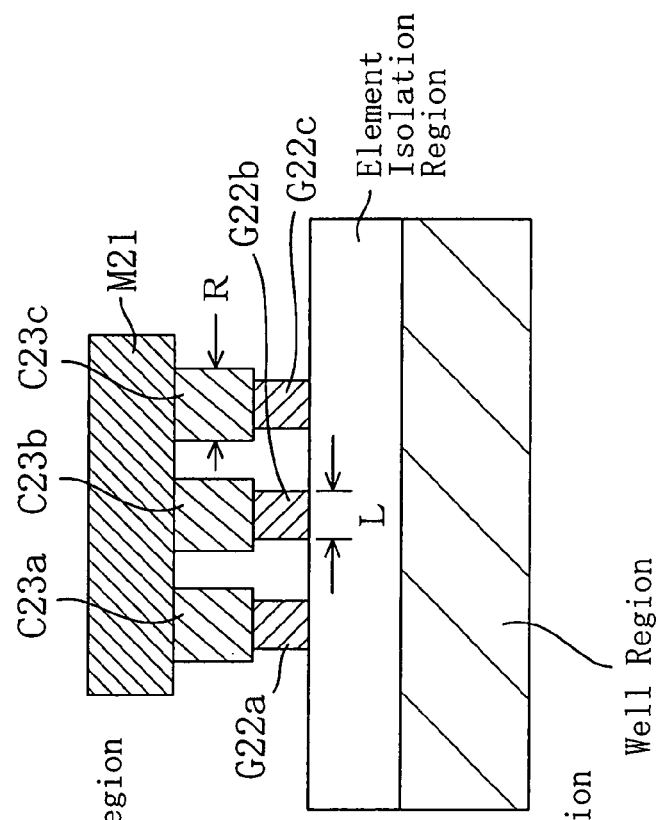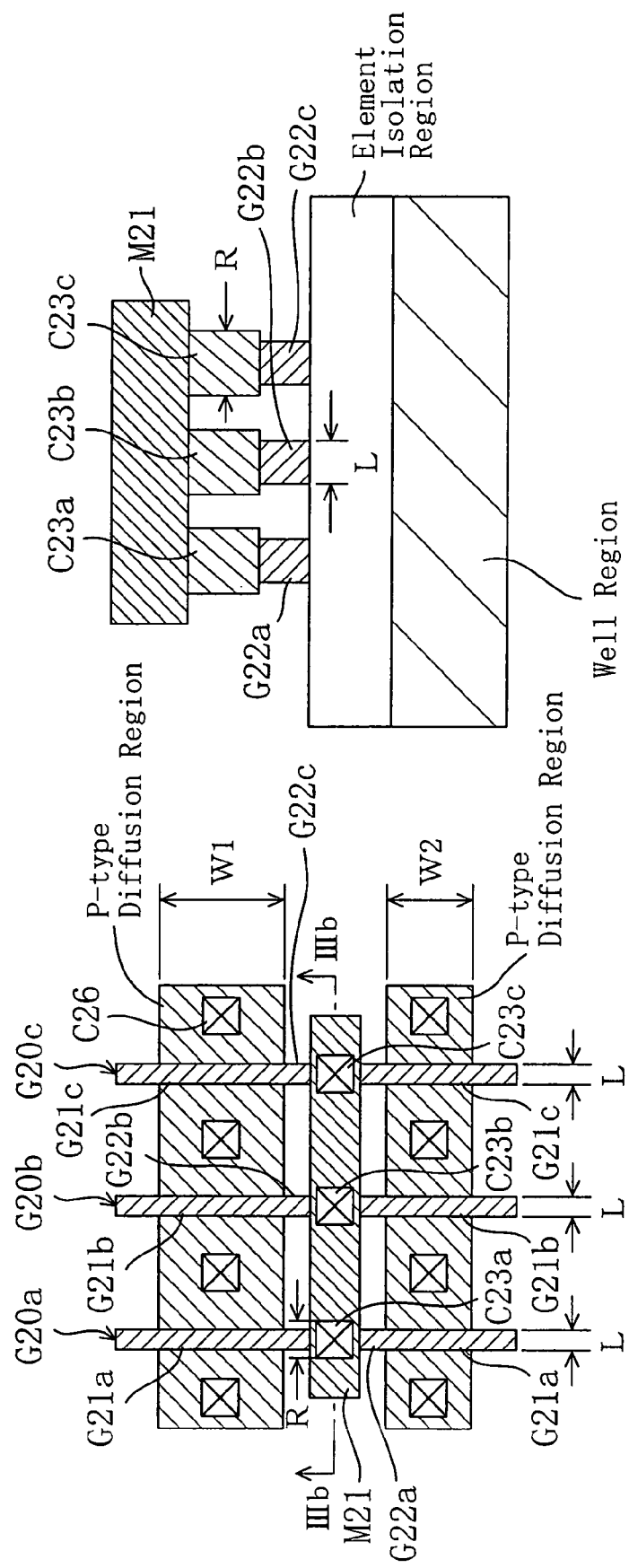

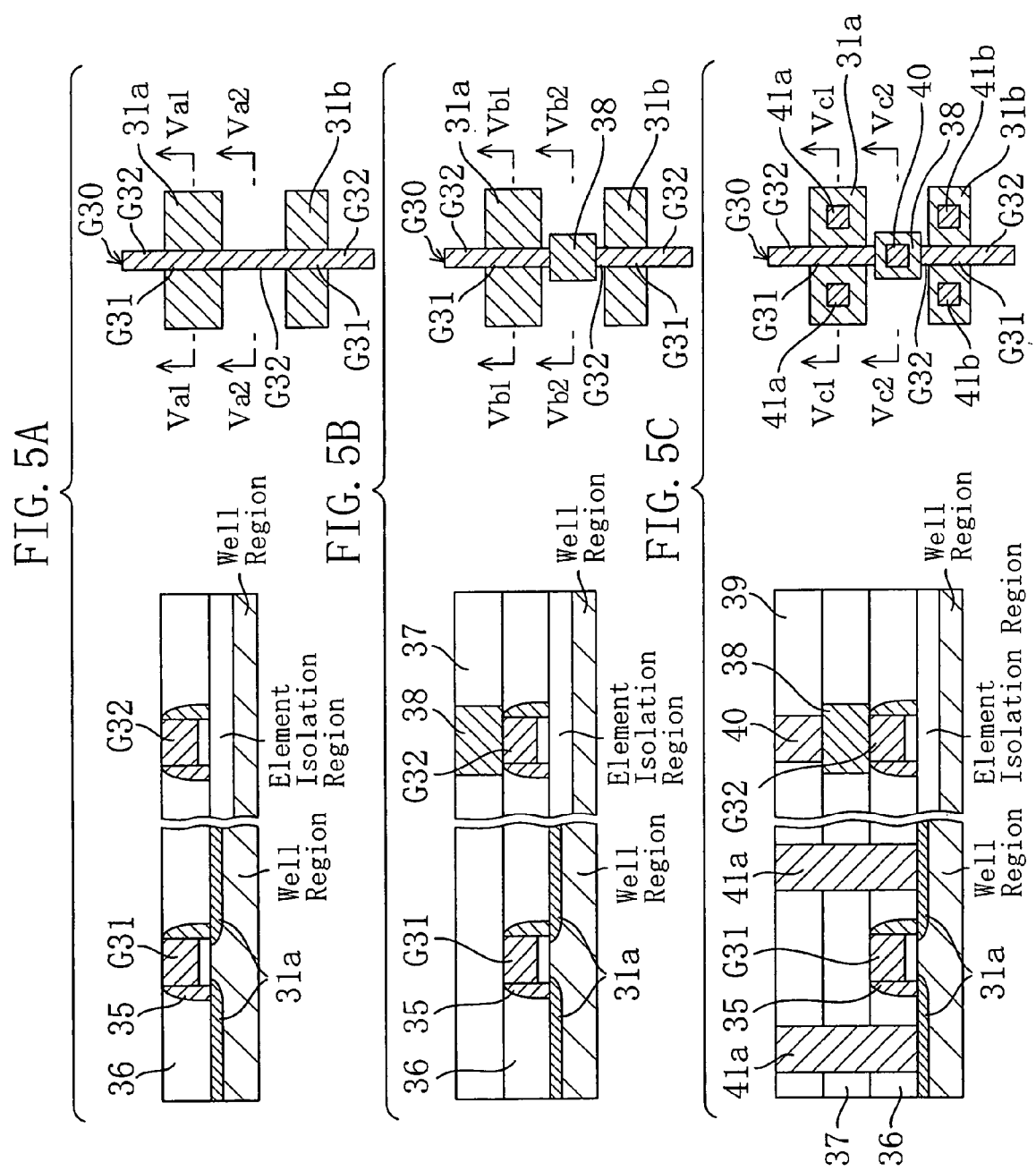

SEMICONDUCTOR DEVICE

This application is a Divisional of U.S. application Ser. No. 11/148,208, filed Jun. 9, 2005, now U.S. Pat. No. 7,279,727 claiming priority of Japanese Application No. 2004-213903, filed Jul. 22, 2004, the entire contents of each of which are hereby incorporated by reference.

CROSS-REFERENCE TO RELATED APPLICATIONS

The present application claims priority under 35 USC 119 (a) to Japanese Patent Application No. 2004-213903 filed on Jul. 22, 2004 the entire contents of which are hereby incorporated by reference.

BACKGROUND OF THE INVENTION (a) Field of the Invention

The present invention relates to a semiconductor device having a miniaturized transistor, and particularly to a measure against an optical proximity effect.

(b) Description of the Related Art

Main factors causing variations in propagation delay time in a design of a semiconductor integrated circuit (LSI) include variations in operating power supply voltage, temperature, process, etc. The LSI should be designed so that its operation is ensured even when all the factors are worst. Among determinants of a transistor, the gate length is a particularly important determinant which defines the operation of the transistor. The variations in the gate length thus affect variations in process greatly. As the transistor is reduced in size, the gate length has been becoming much shorter and the variations in the gate length have been widening. As a result, the variations in propagation delay time have also widened and the design margin has increased, and thereby it has become difficult to provide the LSI having high performance.

In general, in a semiconductor fabricating process, a photolithographic step including resist application, light exposure and development, an etching step for patterning the elements with a resist mask, and a resist removing step are repeated to form an integrated circuit on a semiconductor substrate. In forming a gate of the transistor, the photolithographic step, the etching step and the resist removing step are also performed. In the exposure of the photolithographic step, if the pattern dimension is not more than the exposure wavelength, the optical proximity effect generated by the influence of diffracted light causes a large error between the pattern dimension in the layout design and the actual pattern dimension on the semiconductor substrate.

Techniques for solving the above problems include a super resolution technique using a phase shift mask and an OPC (Optical Proximity Correction) technique for correcting the influence of the optical proximity effect by modifying a circuit pattern drawn on the mask (see e.g., Japanese Unexamined Patent Publication No. H08-272075). However, the optical proximity effect inevitably occurs, and it is difficult to prevent the optical proximity effect only by manufacturing and process techniques such as the super resolution technique and the OPC technique. Therefore, a structure of the semiconductor device which can utilize to the optical proximity effect is desired at the design stage.

As previously mentioned, as the transistor is reduced in size, the gate length becomes shorter and the optical proximity effect caused by diffracted light more affects the gate in exposing the gate to light. The optical proximity effect in the formation of the gate occurs depending on the layout pattern of the gate of the transistor, and causes not only variations in the gate length among the transistors but variations in the gate length along the gate width direction. Particularly, assume that a continuous gate polysilicon film includes a gate electrode part which is a transistor element existing on an active region; a gate interconnect part extending from the gate electrode part onto an element isolation region; and a pad for forming a contact which connects the gate interconnect and an interconnect provided in an upper level. In this case, a reflex angle at the boundary between the pad and the gate interconnect part is rounded due to the optical proximity effect, which causes errors in the dimension of the gate electrode part provided on the active region, namely in the gate length of the transistor.

FIGS. 7A and 7B are a plan view illustrating the design geometry of a known semiconductor device (e.g., standard cell) and a plan view illustrating the geometry of the known semiconductor device after fabricated, respectively.

As shown in FIG. 7A, in the known semiconductor device, a gate polysilicon film is provided across a P-type diffusion region and an N-type diffusion region which are surrounded with an element isolation region made of STI or the like. Of the gate polysilicon film provided across the P-type and N-type diffusion regions and the element isolation region, parts located on the P-type and N-type diffusion regions serve as gate electrode parts (gates) G101, a part located on the element isolation region serves as a gate interconnect part G102. A rectangular enlarged part having a large area near the center of the gate interconnect part G102 serves as a contact pad G103, and the contact pad G103 includes a contact C103 connecting the gate interconnect part G102 and an interconnect provided in an upper level. The P-type diffusion region is provided with a P-type transistor with a gate G101 having a gate width W1 and a gate length L, and the N-type diffusion region is provided with an N-type transistor with a gate G101 having a gate width W2 and a gate length L. In addition, the P-type diffusion region is provided with source/drain contacts C101 and C102 and the N-type diffusion regions is provided with source/drain contacts C104 and C105.

FIG. 7B illustrates the geometry of a semiconductor device which has been actually formed on the semiconductor substrate by subjecting the semiconductor device having the design geometry illustrated in FIG. 7A to a semiconductor device manufacturing process including a photolithographic step, an etching step and a resist removing step. As shown in FIG. 7A, the boundary between the gate interconnect part G102 and the contact pad G103 has a reflex angle rounded under the influence of the optical proximity effect when exposed to light. Accordingly, as shown in FIG. 7B, the end of the diffusion region located on the side near the contact pad G103 has a gate length of L'+ΔL of which ΔL is an error with respect to the desired gate length L' on the design geometry. It is possible to suppress the error of the gate length caused by the optical proximity effect by keeping a sufficient distance between the contact pad G103 and the diffusion region. However, this increases the area of the semiconductor device, decreases integration density, and hence is not practical.

SUMMARY OF THE INVENTION

The object of the present invention is to provide a structure of a semiconductor device which can suppress variations in gate length caused by an optical proximity effect and realize an LSI having high performance even in a miniaturization process.

The semiconductor device of the present invention is provided with a gate conductor film of constant dimension in the gate length direction including a gate electrode part located on a diffusion region and a gate interconnect part located on an element isolation region, wherein the dimension of the gate contact in the gate length direction is larger than that of the gate interconnect part in the gate length direction.

According to the present invention, the gate conductor film has no reflex angle in the plan geometry. This provides a semiconductor device which can suppress variations in the gate length of a MIS transistor caused by the optical proximity effect.

In the case where a plurality of gate conductor films are provided on a single diffusion region, a plurality of gate contacts are provided so as to be in contact with gate interconnect parts, respectively, and an interconnect in contact with the plurality of gate contacts is provided. Thus, the semiconductor device achieves the same function as the MIS transistor having a comb gate while preventing the variations in the gate length of the MIS transistor which would be caused by the optical proximity effect in the known comb gates.

Moreover, in the case where the plurality of gate conductor films are provided on a single diffusion region, a common gate contact extending across the gate interconnect parts is used as the gate contact, thereby simplifying the structure.

In the case where the gate conductor film has an N-type polysilicon film and a P-type polysilicon film, a pair of gate contacts are provided which are individually connected to gate interconnect parts for the N-type and P-type polysilicon films, and an interconnect connected to the pair of gate contacts is provided. According to this structure, it is possible to maintain electrical connection of the gate conductor film even when the gate conductor film is broken at the P-N boundary.

In the semiconductor device of the present invention, a conductor pad having a larger plane area than the gate contact may be further provided on each gate interconnect part to bring the gate contact into contact with the conductor pad. According to this structure, in forming a gate contact hole and source/drain contact holes simultaneously, the gate contact hole can be prevented from reaching the element isolation region.

As mentioned above, according to the present invention, it is possible to suppress variations in gate length of various MIS transistors caused by the generation of the optical proximity effect in the photolithographic step of the MIS transistors. As a result, the design margin can be reduced, and hence the LSI having high performance can be provided.

BRIEF DESCRIPTION OF THE DRAWINGS

FIGS. 1A and 1B are a plan view of the design geometry of a semiconductor device according to a first embodiment of the present invention, and a plan view of the geometry of the semiconductor device after fabricated, respectively;

FIGS. 2A, 2B and 2C are a plan view of the geometry of a gate polysilicon film provided on an element isolation region prior to the formation of an interconnect of a semiconductor device according to a second embodiment of the invention, a plan view of the geometry of the gate polysilicon film and other features after the formation of the interconnect, and a cross sectional view of the geometry thereof taken along line IIc-IIc of FIG. 2B, respectively;

FIGS. 3A and 3B are a plan view of a gate polysilicon film and other features of a semiconductor device according to a third embodiment of the invention, and a cross sectional view thereof taken along line IIIb-IIIb of FIG. 3A, respectively;

Figures 6A, 6B, 6C:
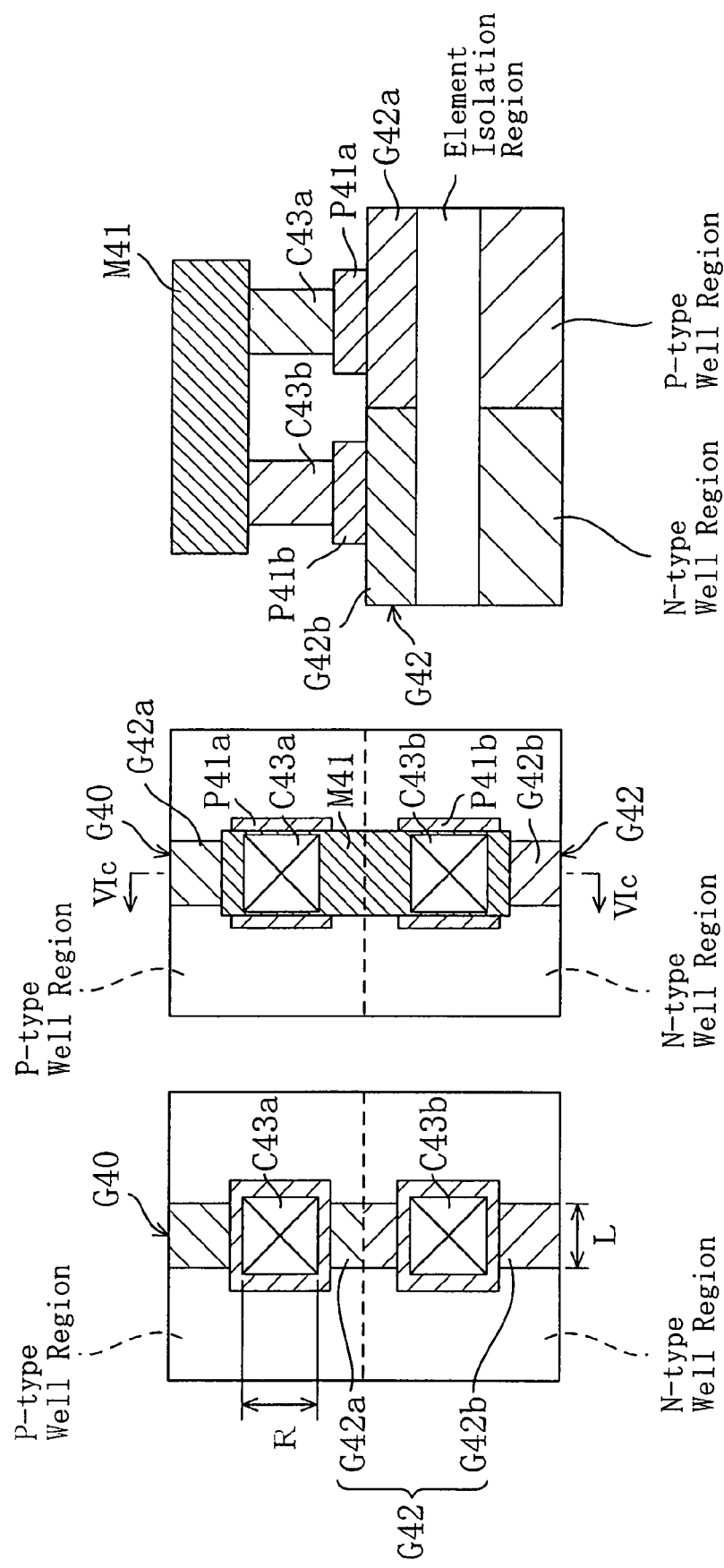
Figure 7A:
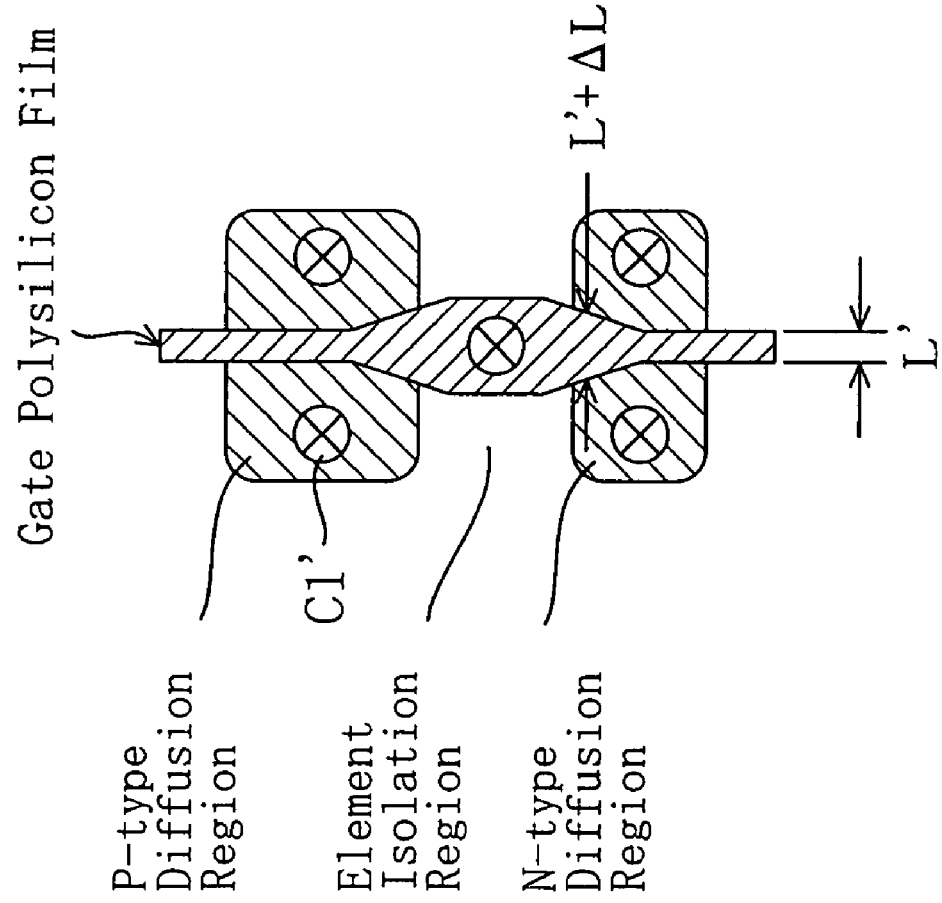
Figure 7B:
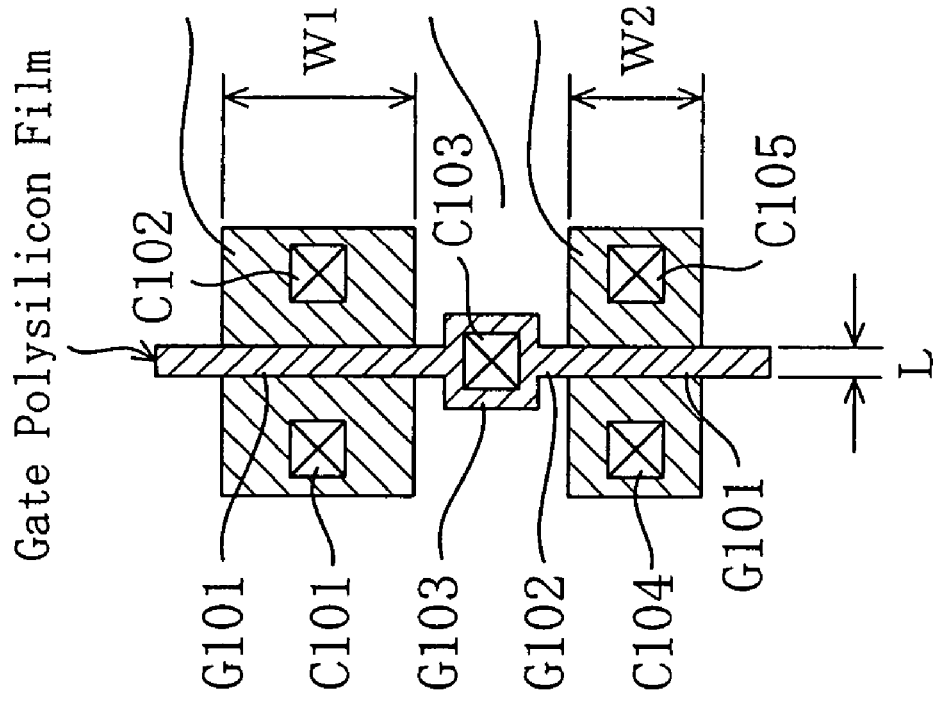

Left sides of FIGS. 5A to 5C are cross sectional views illustrating parts of a manufacturing process of a semiconductor device according to a fourth embodiment of the invention, and right sides of FIGS. 5A to 5C are plan views thereof;

FIGS. 6A, 6B and 6C are a plan view of the geometry of the gate polysilicon film provided on the element isolation region prior to the formation of the interconnect of the semiconductor device according to a modification of the fourth embodiment, a plan view of the geometry of the gate polysilicon film and other features after the formation of the interconnect, and a cross sectional view of the geometry thereof taken along line VIc-VIc of FIG. 6B, respectively; and FIGS. 7A and 7B are a plan view illustrating the design geometry of a known semiconductor device (e.g., standard cell) and a plan view illustrating the geometry of the known semiconductor device after fabricated, respectively.

DETAILED DESCRIPTION OF THE INVENTION

First Embodiment

A first embodiment of the present invention will be described below with reference to the drawings. FIGS. 1A and 1B are a plan view of the design geometry of a semiconductor device (e.g., standard cell) according to the first embodiment of the invention, and a plan view of the geometry thereof after fabricated, respectively.

As shown in FIG. 1A, in the semiconductor device of the first embodiment, a gate polysilicon film is provided across a P-type diffusion region and an N-type diffusion region which are surrounded with an element isolation region made of STI or the like. Of the gate polysilicon film G0 which is used as a gate conductor film provided across the P-type and N-type diffusion regions and the element isolation region, its parts located on the P-type and N-type diffusion regions serve as gate electrode parts (gates) G1, and its part located on the element isolation region serves as a gate interconnect part G2. The gate interconnect part G2 is provided with a contact C3 for connecting the gate interconnect part G2 to an interconnect provided in an upper level. The P-type diffusion region is provided with a P-type transistor with a gate G1 having a gate width W1 and a gate length L, and the N-type diffusion region is provided with an N-type transistor with a gate G1 having a gate width W2 and a gate length L. In addition, the P-type diffusion region is provided with source/drain contacts C1 and C2, and the N-type diffusion region is provided with source/drain contacts C4 and C5.

Here, as shown in FIG. 1A, the features of the design geometry of the semiconductor device according to the first embodiment reside in that a contact pad is not provided in the gate interconnect part while it is provided in the known semiconductor devices, and that the plan geometry of the gate polysilicon film G0 is linear (rectangular). In addition, the contact C3 provided on the gate polysilicon film G0 has a diameter R (especially a dimension in the gate length direction) larger than the dimension of the gate polysilicon film G0 in the gate length direction.

FIG. 1B illustrates the geometry of a semiconductor device which has been actually formed on the semiconductor substrate by subjecting the semiconductor device having the design geometry illustrated in FIG. 1A to a semiconductor device manufacturing process including a photolithographic step, an etching step and a resist removing step.

As shown in FIG. 1B, the gate polysilicon film G0 formed on the semiconductor substrate maintains a linear (rectangular) shape. This is because the design geometry of the gate polysilicon film G0 shown in FIG. 1A has no reflex angle, and thereby no optical proximity effect occurs. Accordingly, in the semiconductor device of the first embodiment, the dimension of the gate polysilicon film in the gate length direction has a substantially constant value L' in all over the element isolation region and the P-type and the N-type diffusion regions.

In the first embodiment, the plan design geometry of the gate polysilicon film G0 is made linear (rectangular) and the dimension thereof in the gate length direction is made constant. Therefore, it is possible to keep the dimensions of gate electrode parts G1' in the gate length direction, which are provided on the diffusion regions, constant without widening the width of the element isolation region separating the active regions. As a result, it is possible to suppress variations in the dimension in the gate length direction due to the optical proximity effect while keeping the integration density of the semiconductor device high.

Second Embodiment

The above first embodiment has described the structure of the semiconductor device which suppresses variations in the gate length of the MIS transistor due to the optical proximity effect by making the gate electrode linear (rectangular) and the dimension thereof in the gate length direction constant.

Now, in a CMOS device having a dual-gate structure, a p-type impurity is doped into the gate electrode of a P-channel MIS transistor, and an n-type impurity is doped into a gate electrode of an N-channel MIS transistor. Therefore, a gate polysilicon film includes part that provides an N-type polysilicon film on a P-type well region and part that provides a P-type polysilicon film on an N-type well region. Therefore, when the dimension of the gate polysilicon film in the gate length direction at the boundary between the N-type and the P-type polysilicon films is smaller than a certain value, the gate polysilicon film may be broken.

A second embodiment of the invention will describe a structure that can maintain electrical connection even at the breakage of the gate polysilicon film while having a gate polysilicon film of linear (rectangular) plan geometry.

FIGS. 2A, 2B and 2C are a plan view of the geometry of a gate polysilicon film provided on an element isolation region prior to the formation of an interconnect of a semiconductor device according to the second embodiment, a plan view of the geometry of the gate polysilicon film and a metal interconnect after the formation of the interconnect, and a cross sectional view thereof taken along line IIc-IIc of FIG. 2B, respectively. In FIG. 2C, an interlayer insulating film on which a contact is formed is not shown.

As shown in FIG. 2A, a gate interconnect part G12 of a gate polysilicon film G10 which is used as a linear (rectangular) gate conductor film having a constant dimension in the gate length direction includes an N-type polysilicon film G12a located on a P-type well region and a P-type polysilicon film G12b located on an N-type well region. A first contact C13a is provided on the N-type polysilicon film G12a and a second contact C13b is on the P-type polysilicon film G12b. Each diameter R of the first and the second contacts C13a, C13b is larger than the dimension L of the gate polysilicon film G10 in the gate length direction.

As shown in FIGS. 2B and 2C, after the formation of the interconnect, a metal interconnect M11 is formed on the first and the second contacts C13a, C13b to connect them to each other.

The semiconductor device of the second embodiment is provided with the linear (rectangular) gate polysilicon film G10 having the first and the second contacts C13a, C13b and the metal interconnect M11, whereby electrical connection between the N-type polysilicon film G12a and the P-type polysilicon film G12b can be maintained even when the boundary therebetween is broken.

According to this structure, even when the gate polysilicon film G10 has a linear (rectangular) plan geometry and has a constant dimension in the gate length direction, the breakage of the gate polysilicon film G10 can be prevented in the boundary region between the P-type well and the N-type well regions, i.e., between the N-type polysilicon film and the P-type polysilicon film.

Third Embodiment

FIGS. 3A and 3B are a plan view illustrating the plan geometry of a gate polysilicon film and a metal interconnect of a semiconductor device according to a third embodiment of the invention, and a cross sectional view thereof taken along line IIIb-IIIb of FIG. 3A, respectively. In FIG. 3B, an interlayer insulating film on which a contact is formed is not shown.

As show in FIGS. 3A and 3B, the third embodiment employs, instead of the comb gate, a structure in which gate interconnect parts G21a to G21c of a plurality of linear (rectangular) gate polysilicon films G20a to G20c are electrically connected to one another via a metal interconnect M21.

In the semiconductor device of the third embodiment, the gate polysilicon films are provided across a P-type diffusion region and an N-type diffusion region which are surrounded with an element isolation region made of STI or the like. Of the gate polysilicon films G20a to G20c formed across the P-type and the N-type diffusion regions and the element isolation region, their parts located on the P-type diffusion region serve as gate electrode parts (gates) G21a to G21c, respectively, and their parts located on the N-type region serve as gate interconnect parts G22a to G22c, respectively. The semiconductor device has gate contacts C23a to C23c that pass through the interlayer insulating film and is then connected to the gate interconnect parts G22a to G22c to connect an upper interconnect to the gate polysilicon films G20a to G20c. In addition, the semiconductor device has the metal interconnect M21 that is connected to the gate contact C23a to C23c. The gate contacts C23a to C23c have a diameter R (especially a dimension in the gate length direction) larger than the dimension L of the gate polysilicon film G20 in the gate length direction.

The P-type diffusion region is provided with a P-type MIS transistor with gates G21a to G21c having a gate width W1 and a gate length L, and the N-type diffusion region is provided with an N-type MIS transistor with the gates G21a to G21c having a gate width W2 and a gate length L. In addition, each of the P-type and N-type diffusion regions is provided with source/drain contacts C26.

The known comb gate electrode has a structure in which a reflex angle always exists at the connection part of each gate, which generates variations in the gate length of the MIS transistor due to the optical proximity effect in the manufacturing process. On the other hand, in the third embodiment, the plurality of gate polysilicon films are electrically connected to one another by the metal interconnect via the contacts provided on the gate interconnect parts, and therefore it is possible to make each gate polysilicon film linear (rectangular) and keep the constant dimension in the gate length direction. As a result, the variations in the gate length of the MIS transistor due to the optical proximity effect can be suppressed.

Note that when the third embodiment is applied to cells requiring exacting tolerances for the gate length of a MIS transistor, such as a clock cell, significant effects can be achieved.

—Modifications of Third Embodiment—

Figure 4A:
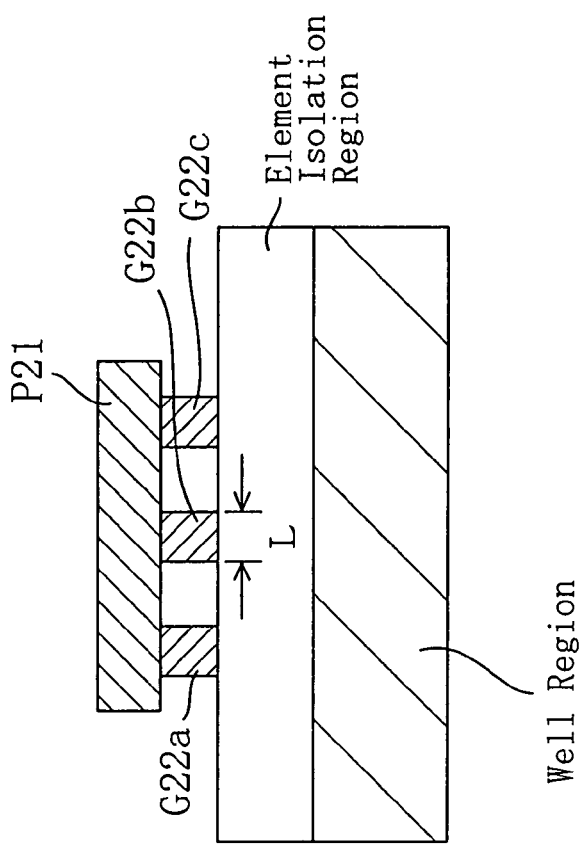
FIGS. 4A and 4B are a plan view illustrating a first modification of the third embodiment, and a cross sectional view illustrating a second modification thereof, respectively.
Figure 4B:
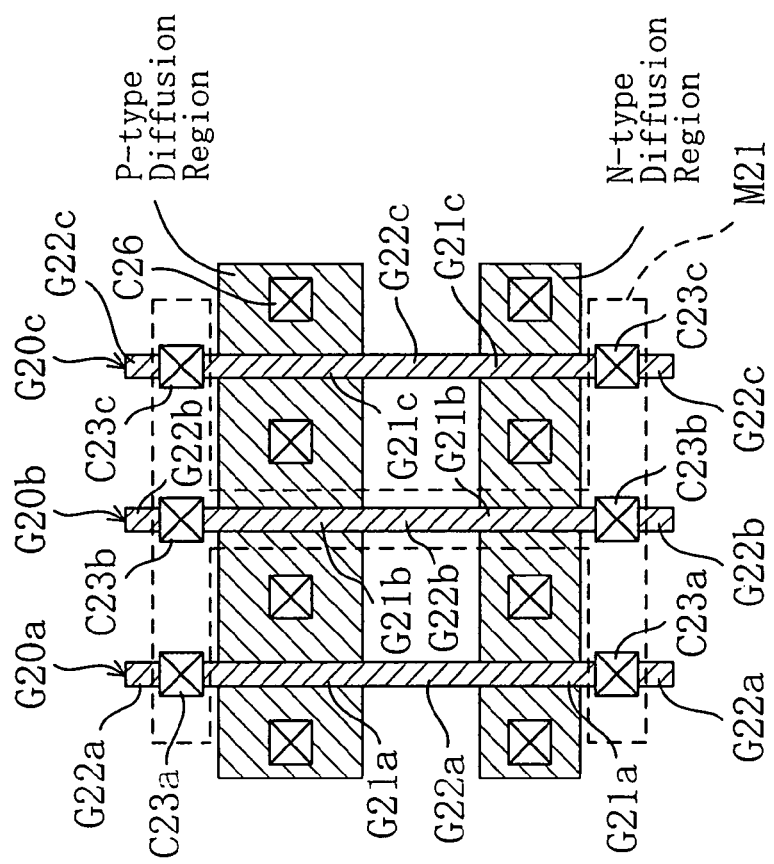

FIGS. 4A and 4B are a plan view illustrating a first modification of the third embodiment, and a cross sectional view illustrating a second modification thereof, respectively.

As shown in FIG. 4A, a semiconductor device according to the first modification of the third embodiment has, instead of the contacts provided on the gate interconnect parts and on part of the element isolation region located between the P-type and the N-type diffusion regions, pairs of contacts C23a, C23a to C23c, C23c provided on the gate interconnect parts G22a to G22c and on parts of the element isolation region between which the P-type diffusion region and the N-type diffusion region are interposed. The semiconductor device also has a metal interconnect M21 provided on the pairs of contacts C23a, C23a to C23c, C23c to electrically connect the contacts C23a, C23a to C23c, C23c to one another. The structures of the gate polysilicon films G20a to G20c, the P-type diffusion region and the N-type diffusion region and the source/drain contacts C26 are the same as in the third embodiment.

Although not shown, an N-type well region and a P-type well region are provided below the P-type and the N-type diffusion regions, respectively, and the gate polysilicon films G20a to G20c serve as the P-type polysilicon film on the N-type well region and as the N-type polysilicon film on the P-type well region. Therefore, each of the gate polysilicon films G20a to G20c has the boundary between the P-type polysilicon film and the N-type polysilicon film in the vicinity of the middle between the N-type and P-type well regions.

According to the first modification, like the third embodiment, it is possible to suppress the variations in the gate length of the MIS transistor which would be caused by the optical proximity effect in comb gates. In addition to the effect obtained in the third embodiment, like the second embodiment, it is possible to maintain electrical connection of each of the gate polysilicon films G20a to G20c even when the boundary region between the N-type polysilicon film and the P-type polysilicon film is broken.

As shown in FIG. 4B, in the semiconductor device according to a second modification of the third embodiment, the gate interconnect parts G22a to G22c of the gate polysilicon films G20a to G20c are electrically connected to one another via a common gate contact P21 which is formed thereon. In other words, a common gate contact P21 is provided instead of the contacts C23a to C23c and the metal interconnect M21 of the third embodiment.

According to the second modification, like the third embodiment, it is possible to suppress the variations in the gate length of the MIS transistor which would be caused by the optical proximity effect in comb gates.

It can be considered that a mask is not aligned in introducing p-type and n-type impurities for a dual gate into the gate polysilicon film G20. To cope with this, the common gate contact P21 is set to have such a dimension in the direction perpendicular to the gate length that the common gate contact P21 is overlapped with both the N-type polysilicon film and the P-type polysilicon film in plan view. Thereby, in addition to the effect obtained in the third embodiment and like the second embodiment, it is possible to maintain electrical connection of each of the gate polysilicon films G20a to G20c even when the boundary region between the N-type polysilicon film and the P-type polysilicon film is broken.

Note that in the third embodiment, the semiconductor device may be provided with a pad formed on each gate interconnect part as in a fourth embodiment which will be described later, and a plurality of gate contacts each reaching the pad. According to this structure, the effects obtained in the third and the fourth embodiments can be achieved.

In the above case, the pad is provided across the boundary region between the N-type polysilicon film and the P-type polysilicon film. Likewise, it can be considered that a mask is not aligned in introducing the p-type and the n-type impurities for a dual gate into the gate polysilicon film G20. To cope with this, the pad is set to have such a dimension in the direction perpendicular to the gate length that the pad is overlapped with both the N-type polysilicon film and the P-type polysilicon film. Thereby, like the second embodiment, it is possible to maintain electrical connection of each of the gate polysilicon films G20a to G20c even when the boundary region between the N-type polysilicon film and the P-type polysilicon film is broken.

Fourth Embodiment

Left sides of FIGS. 5A to 5C are cross sectional views illustrating parts of a manufacturing process of a semiconductor device according to a fourth embodiment of the invention, and right sides of FIGS. 5A to 5C are plan views thereof. Note that the left side of each of FIGS. 5A to 5C illustrate different cross sectional structures in different two places (i.e., on the diffusion region and the element isolation region), taken along the lines Va1-Va1 and Va2-Va2 in the right side of FIG. 5A, the lines Vb1-Vb1 and Vb2-Vb2 in the right side of FIG. 5B, and the lines Vc1-Vc1 and Vc2-Vc2 in the right side of FIG. 5C.

In the step shown in FIG. 5A, a linear (rectangular) gate polysilicon film G30 having a constant dimension in the gate length direction is formed across an element isolation region and active regions of a substrate. Of the gate polysilicon film G30, parts located on the active regions serve as gate electrode parts (gates) G31, G31 and a part located on the element isolation region serves as a gate interconnect part G32. Next, a thin oxide film or nitride film is deposited on the substrate on which the gate polysilicon film G30 is formed, the oxide film or the nitride film is then anisotropically etched to form sidewalls 35 on the side surfaces of the gate polysilicon film G30. Moreover, using the gate polysilicon film G30 and the sidewalls 35 as a mask, P-type source/drain regions (P-type diffusion regions) 31a are formed in a region of the substrate for the formation of a P-channel MIS transistor and N-type source/drain regions (N-type diffusion regions) 31b are formed in a region of the substrate for the formation of an N-channel MIS transistor. Therefore, a first interlayer insulating film 36 made of an oxide film is deposited on the substrate to cover the gate polysilicon film G30 and the sidewalls 35, and then subjected to a planarization processing by CMP (Chemical Mechanical Polishing) or dry etching to make the top surfaces of the first interlayer insulating film 36, the gate polysilicon film G30 and the sidewalls 35 flush with each other.

In the step shown in FIG. 5B, a second interlayer insulating film 37 made of an oxide film is formed on the first interlayer insulating film 36, the gate polysilicon film G30 and the sidewalls 35, and a hole is formed through the second interlayer insulating film 37 and reach the gate interconnect part G32 of the gate polysilicon film G30. This hole has a diameter larger than the dimension of the gate polysilicon film G30 in the gate length direction and the diameter of a gate contact hole described later, and is overlapped with the N-type polysilicon film and the P-type polysilicon film of the gate polysilicon film G30. Then, planarization processing is performed by CMP (Chemical Mechanical Polishing) or dry etching to form a pad 38 by embedding a metal film into the hole of the second interlayer insulating film 37.

In the step shown in FIG. 5C, a third interlayer insulating film 39 made of an oxide film is formed to cover the second interlayer insulating film 37 and the pad 38, and a gate contact hole is formed which passes through the third interlayer insulating film 39 to reach the pad 38. At this time, source/drain contact holes are simultaneously formed which pass through the third interlayer insulating film 39, the second interlayer insulating film 37 and the first interlayer insulating film 36 and reach the P-type source/drain regions 31a and the N-type source/drain regions 31b. Moreover, the contact holes are filled with tungsten or the like to form a gate contact 40 and source/drain contacts 41a and 41b.

The gate polysilicon film G30 is linear (rectangular) and has a constant dimension in the gate length direction. Thus, if the contact hole formation step shown in FIG. 5C is performed directly, the gate contact hole reaching the gate interconnect part G32 may pass through the first interlayer insulating film 36 and the element isolation region to reach the well regions.

On the other hand, in the fourth embodiment, the pad 38 is formed on the gate interconnect part G32 to have a diameter larger than the dimension of the gate polysilicon film G30 in the gate length direction and the diameter of the gate contact, followed by simultaneous formation of the gate contact hole and the source/drain contact holes. Therefore, it is possible to definitely prevent the gate contact hole from reaching the element isolation region in spite of the linear gate polysilicon film G30 having a constant dimension in the gate length direction.

Also in this embodiment, it can be considered that the mask is not aligned in introducing p-type and n-type impurities for a dual gate into the gate polysilicon film G30. To cope with this, the size of the pad 38 is set such that the pad 38 is overlapped with both the N-type polysilicon film and the P-type polysilicon film. Thereby, like the second embodiment, it is possible to maintain electrical connection of the gate polysilicon film G30 even when the boundary region between the N-type polysilicon film and the P-type polysilicon film is broken.

—Modification of Fourth Embodiment—

FIGS. 6A, 6B and 6C are a plan view of the geometry of the gate polysilicon film provided on the element isolation region prior to the formation of the interconnect of the semiconductor device according to the modification of the fourth embodiment, a plan view of the geometry of the gate polysilicon film and the metal interconnect after the formation of the interconnect, and a cross sectional view thereof taken along line VIc-VIc of FIG. 6B, respectively. In FIG. 6C, the interlayer insulating film on which the contact is formed is not shown.

As shown in FIG. 6A, a gate interconnect part G42 of a linear (rectangular) gate polysilicon film G40 has an N-type polysilicon film G42a located on a P-type well region and a P-type polysilicon film G42b located on an N-type well region. A first contact C43a is provided via a pad P41a on the N-type polysilicon film G42a, and a second contact C43b is provided via a pad P41b on the P-type polysilicon film G42b. The diameter R of the first and the second contacts C43a, C43b is larger than the dimension L of the gate polysilicon film G40 in the gate length direction, and the diameter of the pads P41a, P41b is larger than the diameter R of the first and the second contacts C43a, C43b.

As shown in FIGS. 6B and 6C, after an interconnect formation process step, a metal interconnect M41 is formed on the first and the second contacts C43a, C43b to electrically connect them to each other.

According to the semiconductor device of the modification of the fourth embodiment, the first and the second contacts C43a, C43b and the metal interconnect M41 ensure electrical connection between the N-type polysilicon film G42a and the P-type polysilicon film G42b even when the boundary between the N-type polysilicon film G42a and the P-type polysilicon film G42b is broken because of the linear (rectangular) gate polysilicon film G40.

Therefore, in addition to the effect obtained in the fourth embodiment, the breakage of the gate polysilicon film G40 in the boundary region between the P-type well and the N-type well regions, i.e., between the N-type polysilicon film and the P-type polysilicon film, can be compensated for, even when the gate polysilicon film G40 has a linear (rectangular) plan geometry and a constant dimension in the gate length direction.

In each embodiment, the gate polysilicon film is used as the gate conductor film, but the gate conductor film of the present invention is not limited to the polysilicon film. The gate conductor film may be other conductor films such as a metal film or a polymetallic film in which metal films and polysilicon films are stacked. Also in these cases, the same effects as in each embodiment can be achieved. Moreover, upper portions of the gate polysilicon film and the source/drain regions are in general silicified by a so-called salicide process in employing the present invention although the description is omitted in each embodiment.

The semiconductor device of the present invention can be used for LSIs which are mounted on various electronics, in particular for an LSI with high performance in which variations in the gate length of a MIS transistor are small.

What is claimed is:

1. A semiconductor device, comprising:
   an element isolation region formed on a semiconductor substrate;
   a first active region which comprises the semiconductor substrate surrounded by the element isolation region;
   a first gate conductor film which is formed across the first active region and the element isolation region, and has a substantially constant dimension in a gate length direction;
   an interlayer insulating film formed on the first gate conductor film; and
   a first gate contact which passes through the interlayer insulating film, and is connected to the first gate conductor film,
   wherein the first gate contact has a dimension in the gate length direction larger than the first gate conductor film,
   the first gate contact is connected to a part located on the first gate conductor film and on the element isolation region, and
   the first gate contact is not connected to a part located on the first gate conductor film and on the first active region.

2. The semiconductor device according to claim 1, wherein the first conductor film includes a gate electrode part located on the first active region and a gate interconnect part located on the element isolation region, and
   the first gate contact is connected to the gate interconnect part.

3. The semiconductor device according to claim 1, wherein the first gate conductor film has an polysilicon film.

4. The semiconductor device according to claim 1, wherein the planar shape of the first gate conductor film is a linear shape.

5. The semiconductor device according to claim 2, wherein the gate interconnect part in the first gate conductor film comprises:
- an N-type polysilicon film and a P-type polysilicon film, wherein the first gate contact is connected to the N-type polysilicon film;
- a second gate contact which passes through the interlayer insulating film, and is connected to the P-type polysilicon film; and
- a metal interconnect which is formed on the interlayer insulating film, and connects the first gate contact and the second gate contact.

6. The semiconductor device according to claim 1, further comprising a second active region which comprises the semiconductor substrate surrounded by the element isolation region,
- wherein the first gate conductor film is formed across the first active region, the second active region and the element isolation region located therebetween, and
- the first gate contact is connected to a part located on the first gate conductor film and on the element isolation region between the first and second active regions.

7. The semiconductor device according to claim 6, wherein a P-type MIS transistor is located in the first active region, and
- a N-type MIS transistor is located in the second active region.

8. The semiconductor device according to claim 6, further comprising:
- a second gate conductor film which is formed across the first active region, the second active region and the element isolation region located therebetween, and has a substantially constant dimension in a gate length direction;
- the interlayer insulating film formed on the second gate conductor film;
- a second gate contact which passes through the interlayer insulating film, and is connected to a part located on the second gate conductor film and on the element isolation region between the first and second active regions; and
- a metal interconnect which is formed on the interlayer insulating film, and connects the first gate contact and the second gate contact.

9. The semiconductor device according to claim 1, further comprising a second active region which comprises the semiconductor substrate surrounded by the element isolation region,
- wherein the first gate conductor film is formed across the first active region, the second active region and the element isolation region located therebetween, and
- the first gate contact is connected to a part located on the first gate conductor film and on the element isolation region opposite to the second active region viewed from the first active region.

10. The semiconductor device according to claim 1, further comprising:
- sidewalls on the side surfaces of the first gate conductor film; and
- an insulating film which is formed on the first active region and the upper surface of which is flush with that of the first gate conductor film,
- wherein the interlayer insulating film is formed on the insulating film.

* * * * *